United States Patent
Wu et al.

(10) Patent No.: US 8,044,675 B2
(45) Date of Patent: Oct. 25, 2011

(54) TESTING APPARATUS WITH HIGH EFFICIENCY AND HIGH ACCURACY

(75) Inventors: Yung-Yu Wu, Taipei County (TW); Huei-Huang Chen, Taipei County (TW); Wei-Fen Chiang, Taipei (TW)

(73) Assignee: Princeton Technology Corporation, Xindian District, New Taipei (TW)

( * ) Notice: Subject to any disclaimer, the term of this patent is extended or adjusted under 35 U.S.C. 154(b) by 0 days.

(21) Appl. No.: 12/766,935

(22) Filed: Apr. 26, 2010

(65) Prior Publication Data
US 2010/0271041 A1    Oct. 28, 2010

(30) Foreign Application Priority Data

Apr. 27, 2009  (TW) .............................. 98113936 A (51) Int. Cl.
*G01R 31/00*    (2006.01)
(52) U.S. Cl. .................................. 324/756.01
(58) Field of Classification Search ........................ None
See application file for complete search history.

(56) References Cited

U.S. PATENT DOCUMENTS

| | | | | |
|---|---|---|---|---|
| 5,907,245 A * | 5/1999 | Fredrickson | ............. | 324/756.05 |
| 6,625,557 B1 * | 9/2003 | Perkins et al. | ................. | 702/117 |
| 6,759,842 B2 * | 7/2004 | Weimer | .................... | 324/756.07 |
| 7,602,201 B2 * | 10/2009 | Ysaguirre et al. | ........ | 324/756.02 |
| 2007/0001702 A1 * | 1/2007 | Takasu et al. | ................. | 324/765 |

* cited by examiner

*Primary Examiner* — Huy Q Phan
*Assistant Examiner* — Arleen M Vazquez
(74) *Attorney, Agent, or Firm* — Winston Hsu; Scott Margo (57) ABSTRACT

A testing apparatus includes a public test board, a single DUT (device under test) test board and a holder. The public test board includes a plurality of public test channel sets each having a plurality of public signal terminals for receiving test signals. On the single DUT test board, a plurality first signal terminals are arranged according to the pin layout of a DUT, a plurality second signal terminals are arranged according to the terminal layout of a public channel set, and a plurality traces are arranged for electrically connecting corresponding first and second signal terminals. The holder can connect the pins of the DUT to corresponding first signal terminals.

14 Claims, 7 Drawing Sheets

TESTING APPARATUS WITH HIGH EFFICIENCY AND HIGH ACCURACY

BACKGROUND OF THE INVENTION

1. Field of the Invention

The present invention is related to a testing apparatus, and more particularly, to a testing apparatus with high efficiency and high accuracy.

2. Description of the Prior Art

The variety and number of electronic devices increase with the rapid development of technology. The manufacturing process of each component in these electronic devices during mass production includes circuit design, wafer fabrication/testing, device packaging/testing, and product assembly, etc. Device testing is an essential stage since it screens out defects at the early phase of production so as to reduce manufacturing cost and to guarantee the quality of the final product. Normally, a test flow proceeds by disposing a device under test (DUT) on a test board. The test signals generated by a tester are then transmitted to the DUT via the test board and the test results can thus be recorded. The test board normally includes a plurality of functional holes for containing chips or other electronic devices, or for serving as signal terminals. According to the type of the DUT, traces are fabricated on the test board based on a specific circuit layout so that the functional holes for containing the DUT can be electrically connected to those for transmitting signals.

Figure 1:
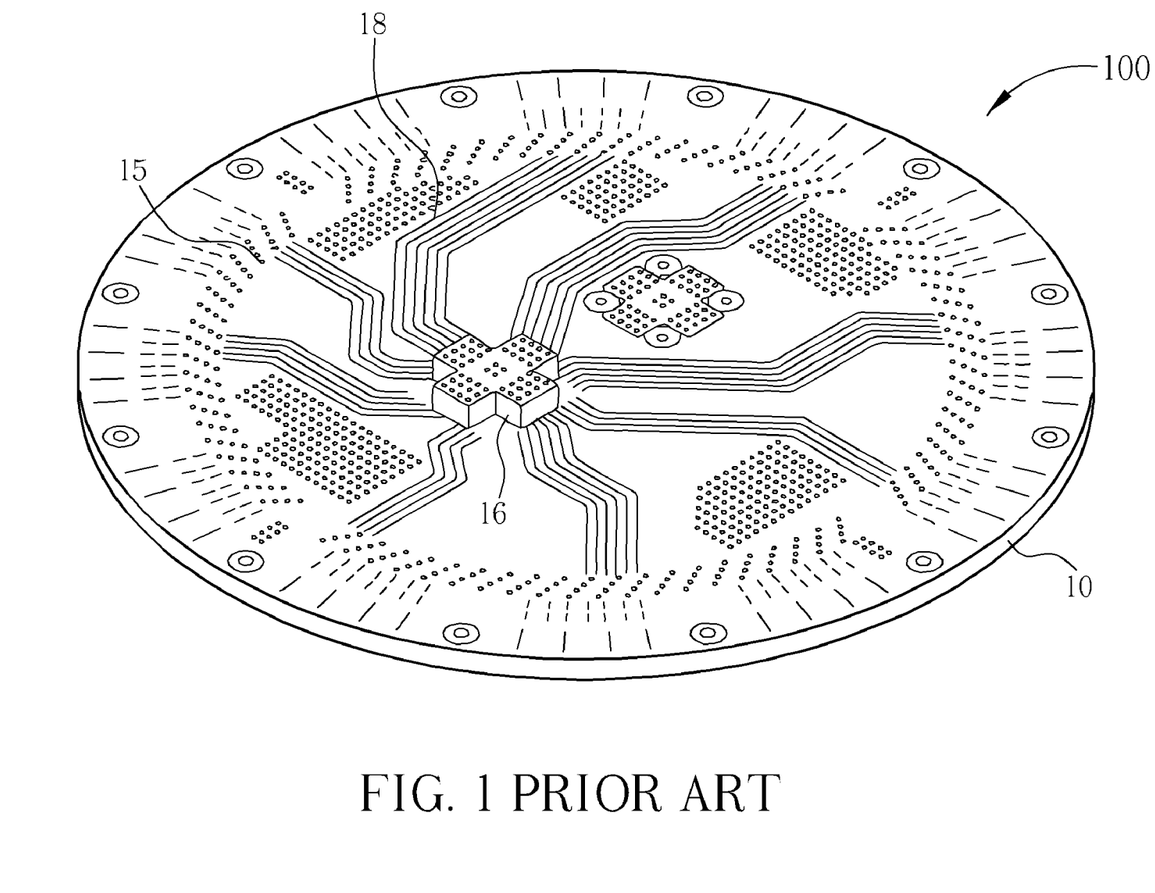
FIG. 1 is a top-view diagram illustrating a prior art testing apparatus.

Reference is made to FIG. 1 for a top-view diagram illustrating a prior art testing apparatus 100. The testing apparatus 100 includes a test board 10 and a holder 16. The holder 10 is disposed on the test board 10 and includes a plurality of jacks. The number and arrangement of the jacks are designed according to the pin layout of a specific DUT. Multiple public test channels 15, disposed on the peripheral region of the test board 10, are electrically connected to the jacks of the holder 16 via a plurality of traces 18. Therefore, by disposing the DUT into the holder 16, test signals generated by a tester can be transmitted to the DUT via the public test channels 15, the traces 18 and the holder 16. The prior art testing apparatus 100, customized for a specific DUT, can not be applied to other types of DUTs. However, various types of electronic devices have different circuit designs, product specifications or operational modes. Due to the high expense of the test boards, it is impractical to use a tailor-made test board 10 for each type of DUT in mass production.

Figure 2:
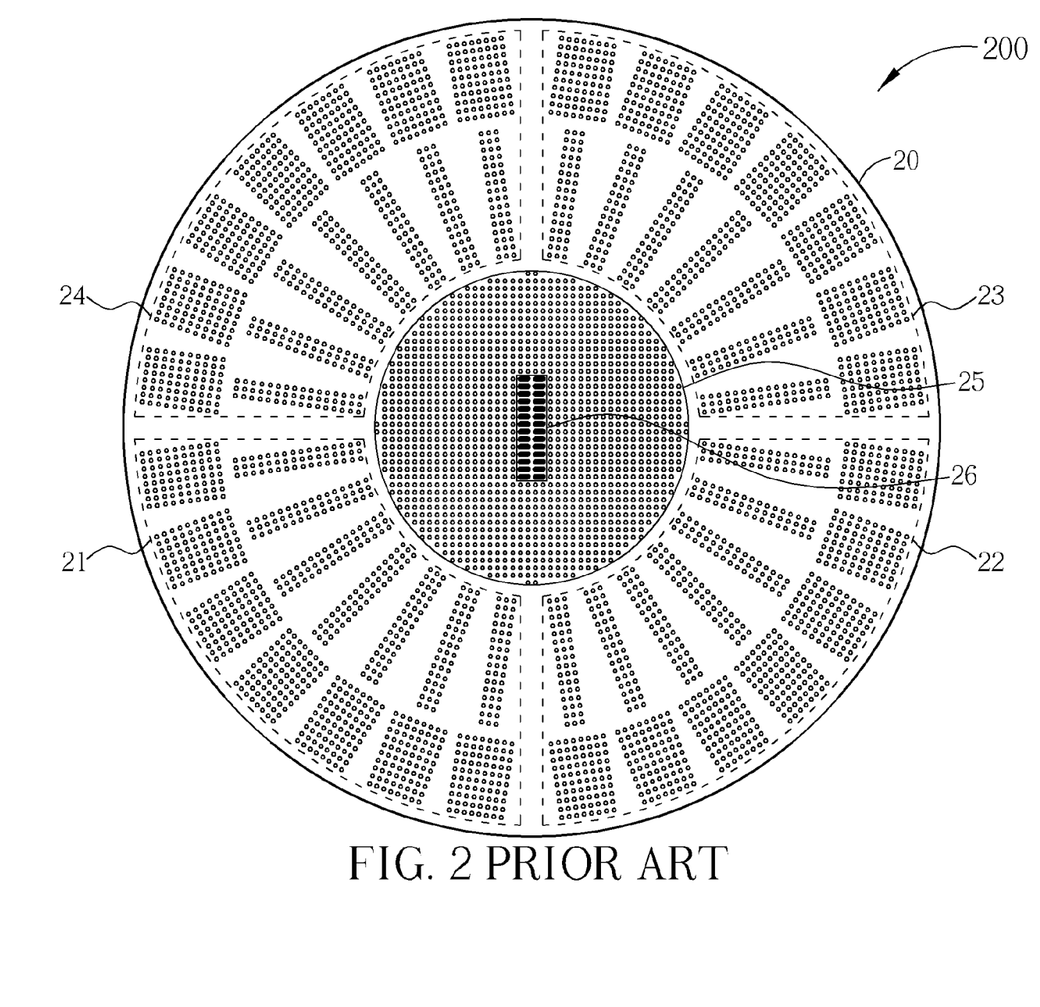
FIG. 2 is a top-view diagram illustrating another prior art testing apparatus.
Figure 3:
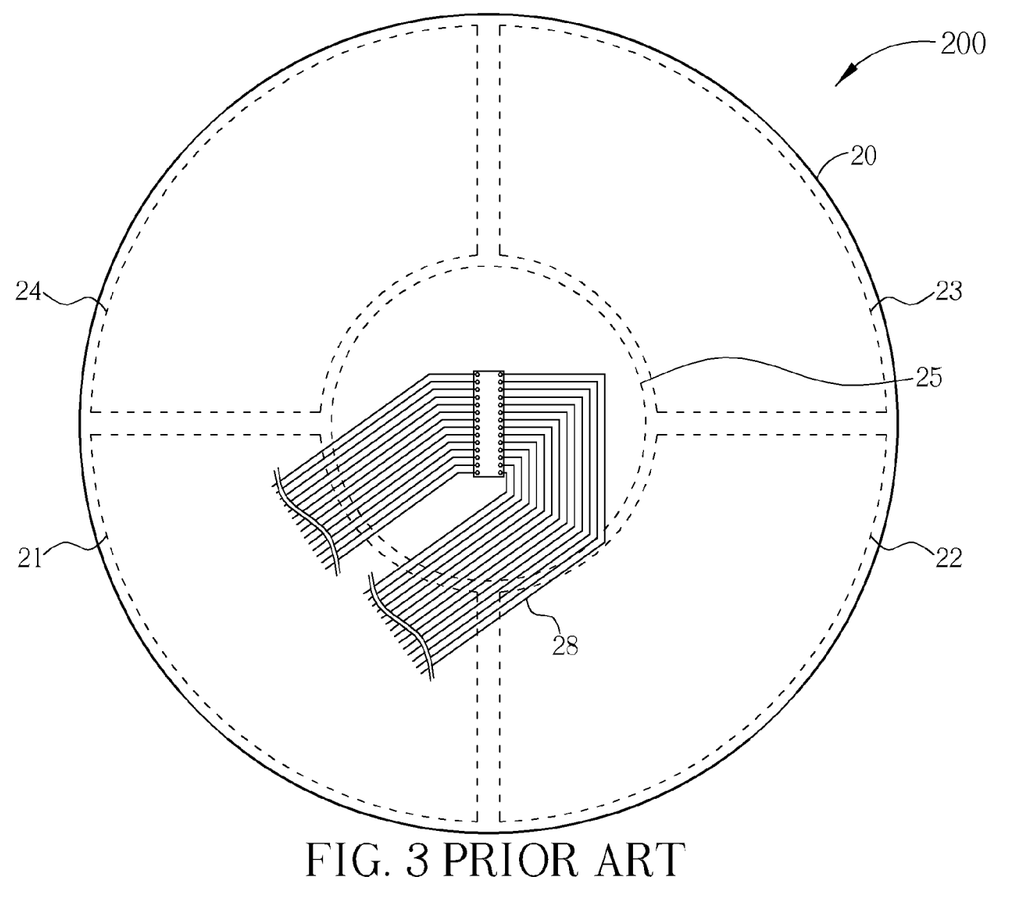
FIG. 3 is a bottom-view diagram illustrating the prior art testing apparatus in FIG. 2.

References are made to FIGS. 2 and 3 for a top-view diagram and a bottom-view diagram illustrating another prior art testing apparatus 200. The testing apparatus 200 includes a public test board 20 and a holder 26. The holder 26 is disposed on the public test board 20 and includes a plurality of sockets and pins. The number and arrangement of the sockets and the pins are designed according to the pin layout of a specific DUT. The public test board 20 includes 4 public test channel sets 21-24 and a plurality of connecting terminals 25. Each of the public test channel sets 21-24, disposed in the peripheral region of the public test board 20 in a symmetrical manner, includes a plurality of public signal terminals for receiving the test signals transmitted from the tester. The connecting terminals 25 are disposed in the central region of the public test board 20. Prior to performing tests, the pins of the holder 26 are welded onto appropriate connecting terminals 25. The connecting terminals 25 containing the pins of the holder 26 are then electrically connected to appropriate public signal terminals among the public test channels 21-24 via the manually-welded wires 28. Therefore, by inserting the DUT into the holder 26, the test signals generated by the tester can be transmitted to the DUT via the public test channels 21-24, the wires 28 and the holder 26.

The prior art testing apparatus 200 having the plurality of connecting terminals 25 can be applied to the holders 26 which are designed for various types of DUTs. However, the wires 28 need to be manually welded before testing different types of DUTs. Not only time—and labor—consuming, the quality of manual welding also largely influences the accuracy of the test. Meanwhile, since the public signal terminals in the public test channel sets 21-24 have a symmetrical arrangement, only one of the public test channel sets 21-24 is required for testing a specific DUT. However, since the manually-welded wires 28 occupy large space, there may not be sufficient space in the testing apparatus 200 for containing multiple holders 26. In order to test multiple DUTs simultaneously, the wires 28 may have a very complicated arrangement which lengthens the welding process and increases the time for subsequent debugging. The prior art testing apparatus 200 requires highly-sophisticated welding techniques, consumes more labor and provides low test efficiency.

SUMMARY OF THE INVENTION

The present invention includes a testing apparatus with high efficiency and high accuracy comprising a public test board, a single device under test (DUT) test board and a holder. The public test board comprises a plurality of public test channel sets each having a plurality of public signal terminals for receiving test signals. The single DUT test board for testing a DUT comprises a plurality of first signal terminals arranged on the single DUT test board according to a pin layout of the DUT for respectively transmitting test signals to corresponding pins of the DUT; a plurality of second signal terminals corresponding to a first public test channel set among the plurality of public test channel sets, and arranged on the single DUT test board according to a terminal layout of the first public test channel set for respectively receiving test signals transmitted from the first public test channel set; and a plurality of traces for electrically connecting the first signal terminals with the corresponding second signal terminals respectively. The holder comprises a plurality of sockets for containing the pins of the DUT and a plurality of pins respectively connected to the corresponding first signal terminals of the single DUT test board.

These and other objectives of the present invention will no doubt become obvious to those of ordinary skill in the art after reading the following detailed description of the preferred embodiment that is illustrated in the various figures and drawings.

DETAILED DESCRIPTION

Figure 4:
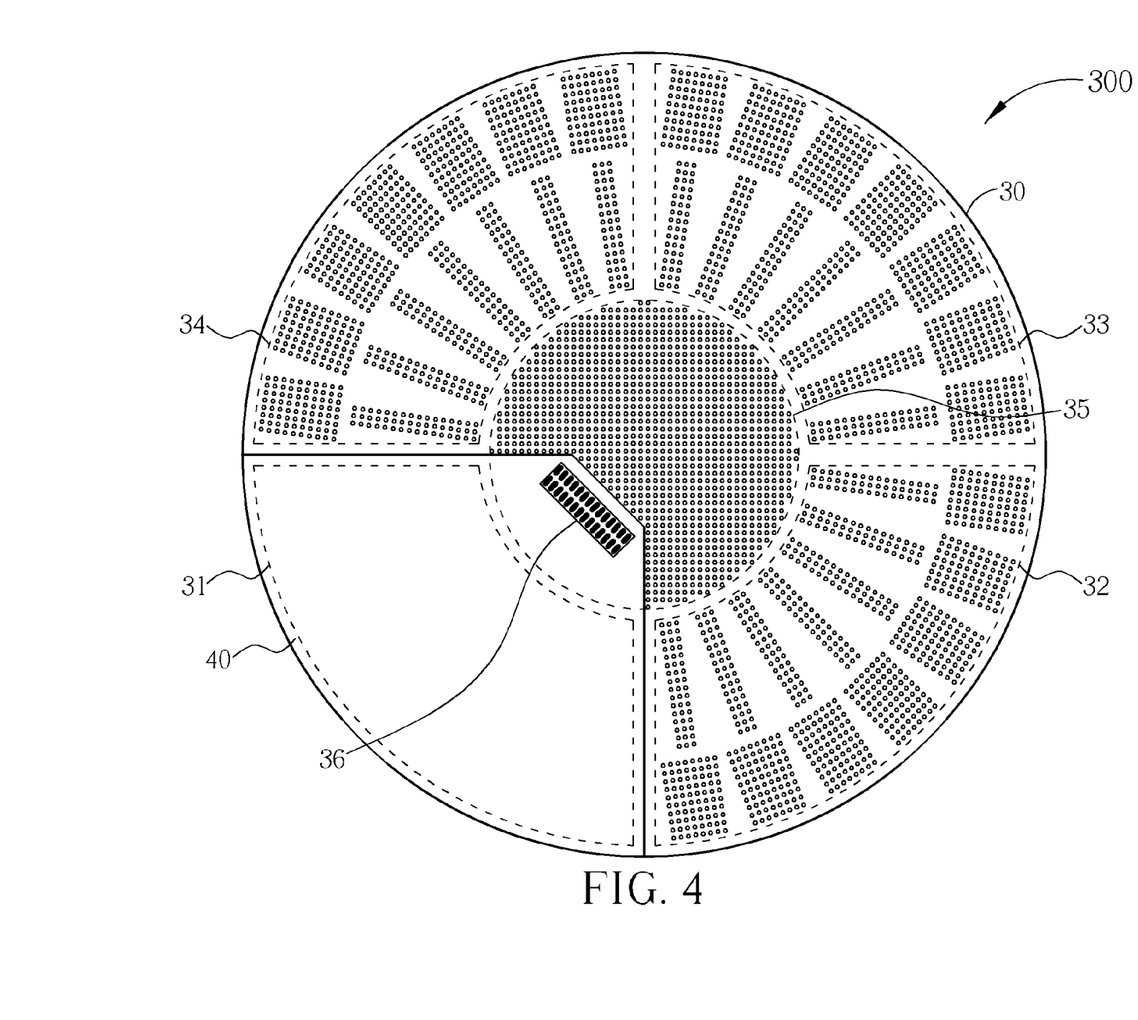
FIG. 4 is a top-view diagram illustrating a testing apparatus according to a first embodiment of the present invention.

Reference is made to FIG. 4 for a top-view diagram illustrating a testing apparatus 300 according to a first embodiment of the present invention. The testing apparatus 300 includes a public test board 30, a single DUT test board 40 and a holder 36. The holder 36 is disposed on the single DUT test board 40 and includes a plurality of sockets and pins. The number and arrangement of the sockets and the pins are designed according to the pin layout of a specific DUT. The public test board 30 includes 4 public test channel sets 31-34 and a plurality of connecting terminals 35. Each of the public test channel sets 31-34, disposed in the peripheral region of the public test board 30 in a symmetrical manner, includes a plurality of public signal terminals for receiving the test signals transmitted from the tester. The connecting terminals 35 are disposed in the central region of the public test board 30. The number and arrangement of the sockets and the pins in the holder 35 are designed according to the pin layout of a specific DUT. Therefore, by inserting the DUT into the sockets of the holder 36, signals can be transmitted via the pins of the holder 36.

Figure 5:
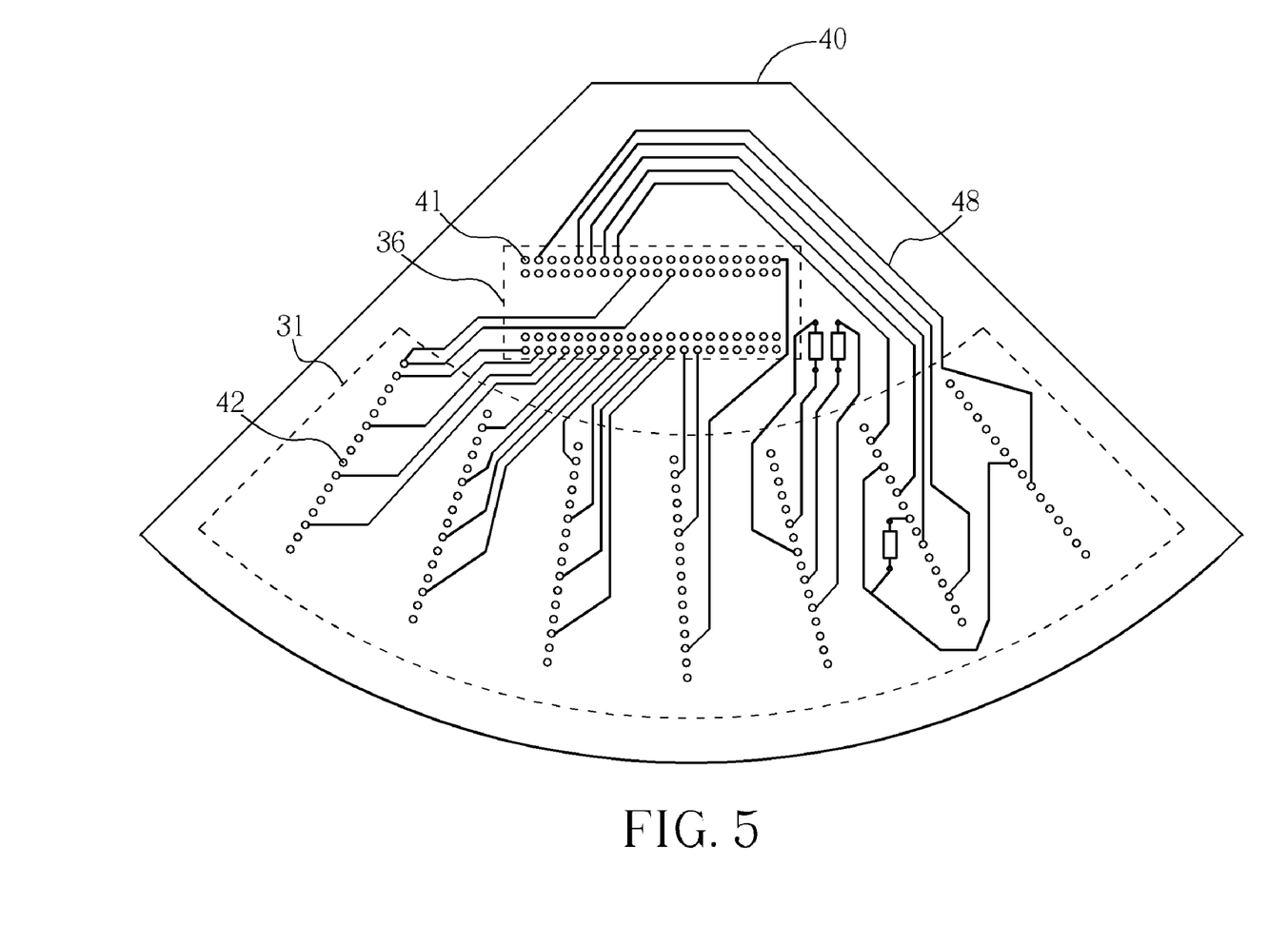
FIG. 5 is an enlarged diagram illustrating a single DUT test board according to the present invention.

Reference is made to FIG. 5 for an enlarged diagram of the single DUT test board 40 according to the present invention. A plurality of first signal terminals 41, a plurality of second signal terminals 42 and a plurality of traces 48 are arranged on the single DUT test board 40. The number and arrangement of the first signal terminals 41 are designed according to the pin layout of the holder 36. The pins of the holder 36 can thus be welded to the corresponding first signal terminals 41. Due to the symmetrical arrangement of the public signal terminals, only one of the public test channel sets 31-34 is required for testing the specific DUT. Therefore, the number and arrangement of the second signal terminals 42 can be designed according to the terminal layout of a public test channel set (such as the public test channel set 31). Among the second signal terminals 42, those required for testing the DUT can then be welded to the corresponding public signal terminals of the public test board 30, as well as be electrically connected to the corresponding first signal terminals 41 via the traces 48. In other words, the test signals generated by the tester are transmitted to the DUT via the public signal terminals of the public test board 30, the second signal board 42, the traces 48, the first signal terminals and the pins of the holder 36.

Figure 6:
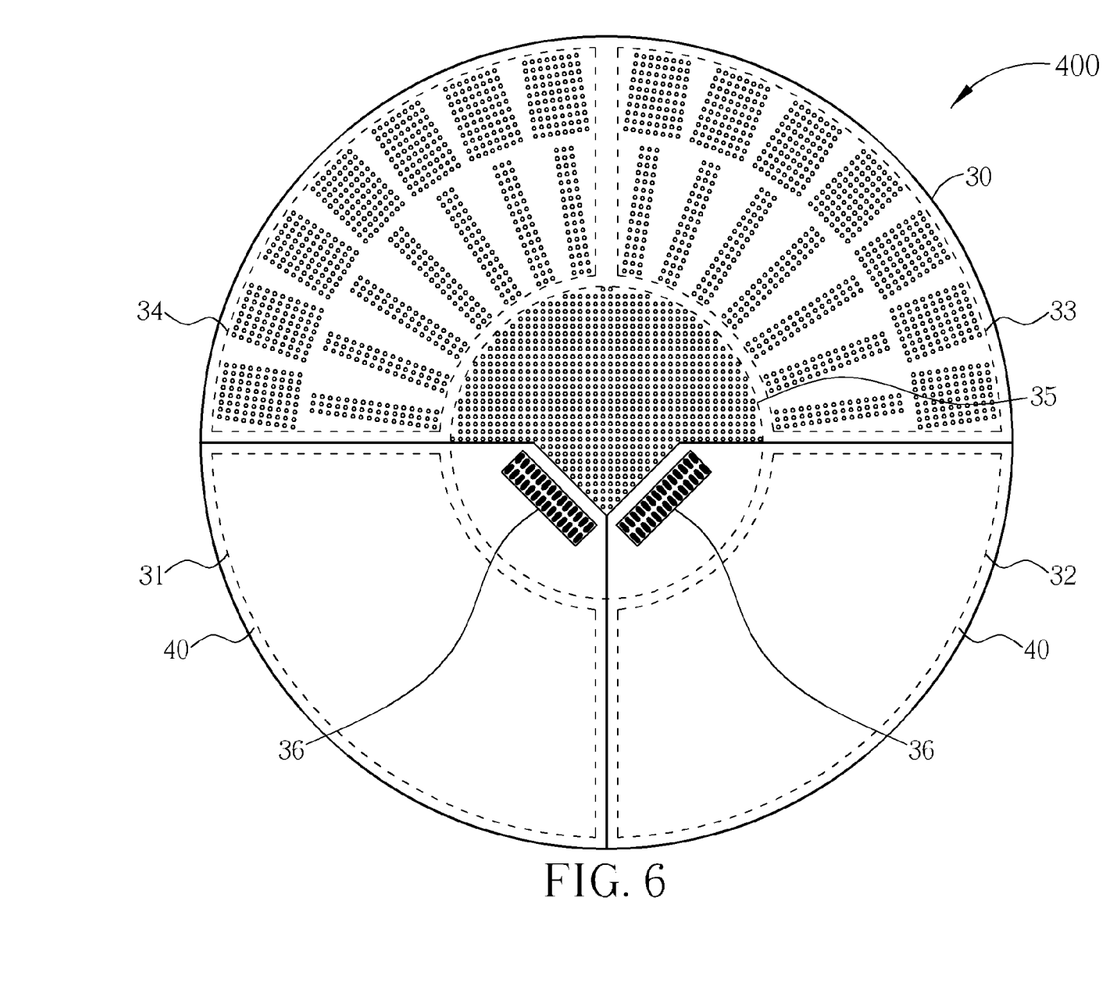
FIG. 6 is a top-view diagram illustrating a testing apparatus according to a second embodiment of the present invention.

Reference is made to FIG. 6 for a top-view diagram illustrating a testing apparatus 400 according to a second embodiment of the present invention. The testing apparatus 400 includes a public test board 30, two single DUT test boards 40 and two holders 36. Similar in structures, the second embodiment differs from the first embodiment of the present invention in that the testing apparatus 400 of second embodiment includes two identical single DUT test boards 40 and two identical holders 36 so that two DUTs of the same type can be tested at the same time. According to the layout of the testing apparatus 400 illustrated in FIG. 6, a maximum number of four DUTs of the same type can be tested simultaneously. However, the present invention can also adopt other layouts so that more DUTs of the same type can be tested simultaneously.

Figure 7:
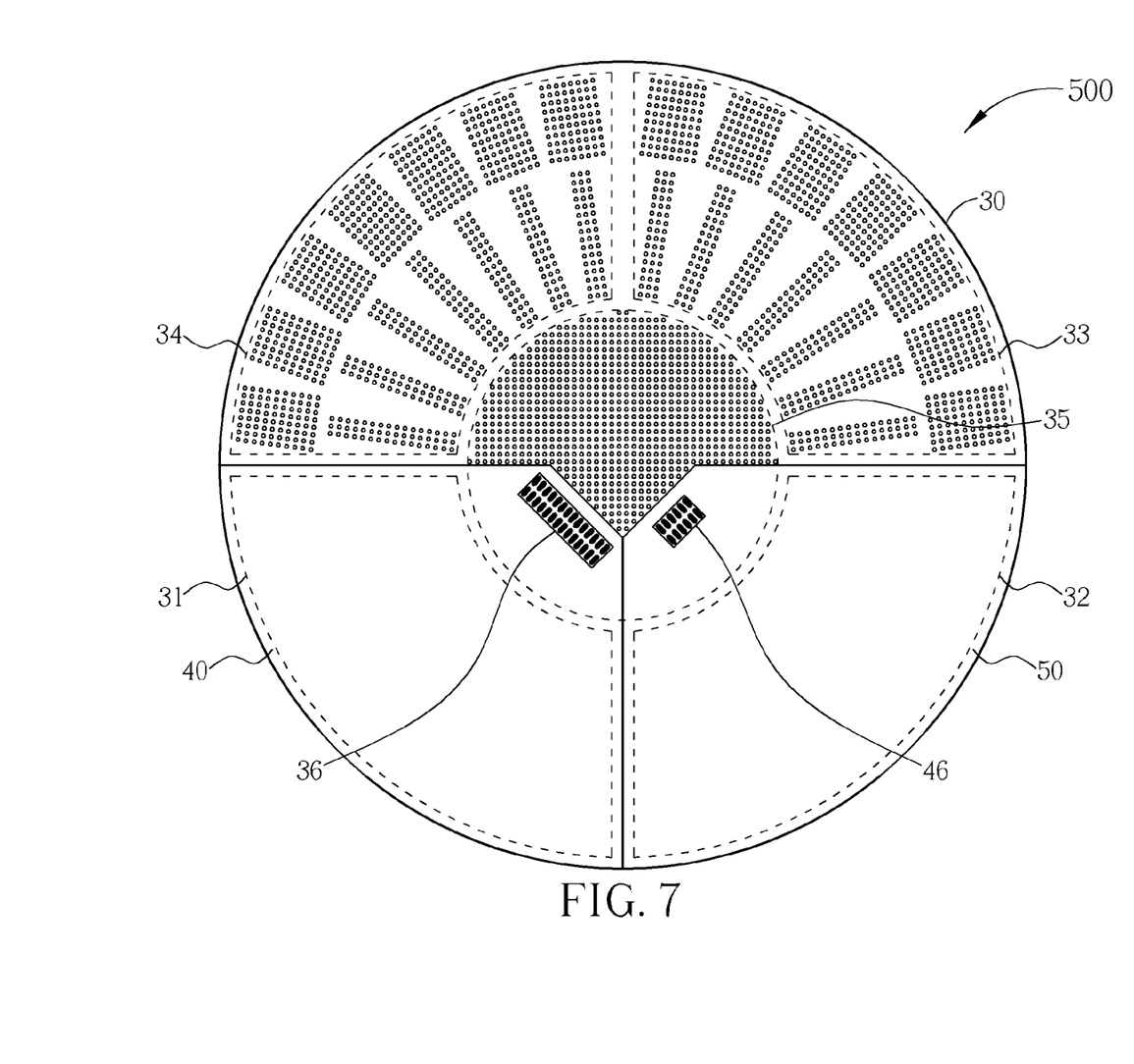
FIG. 7 is a top-view diagram illustrating a testing apparatus according to a third embodiment of the present invention.

Reference is made to FIG. 7 for a top-view diagram illustrating a testing apparatus 500 according to a third embodiment of the present invention. The testing apparatus 500 includes a public test board 30, two single DUT test boards 40 and 50, and two holders 36 and 46. The structures of the single DUT test boards 40, 50 and the holders 36, 46 are similar to the embodiments illustrated in FIGS. 4 and 5, wherein the single DUT test board 40 and the holder 36 are designed according to a first DUT, while the single DUT test board 50 and the holder 46 are designed according to a second DUT. Therefore, the number and arrangement of the socket/pin in the holders, the number and arrangement of the signal terminals in the single DUT test boards, or the trace layout of the single DUT test boards may be different. Similar in structures, the third embodiment differs from the first embodiment of the present invention in that the testing apparatus 500 of third embodiment includes two distinct single DUT test boards and two distinct holders so that two types of DUTs can be tested at the same time. According to the layout of the testing apparatus 500 illustrated in FIG. 7, at most four types of DUTs can be tested simultaneously. However, the present invention can also adopt other layouts so that more type of DUTs can be tested simultaneously.

In the testing apparatus of the present invention, the number and arrangement of the signal terminals may vary according to the type of the tester or the DUT. In the preferred embodiment of the present invention, the amount of all public signal terminals in the public test board is more than the amount of all second signal terminals in the single test board, the amount of all second signal terminals in the single DUT test board is more than the amount of all first signal terminals in the single DUT test board, and the amount of all first signal terminals in the single DUT test board is more than the amount of pins in the holder. However, the embodiments shown in FIGS. 4-7 merely illustrate the structures of the testing apparatus, but do not limit the scope of the present invention. Also, the single DUT test board of the present invention can be a printed circuit board (PCB) whose area is smaller than or equal to that of the public testing board. The single DUT test board can be fan-shaped as shown in FIGS. 4-7, as well as of other shapes.

Those skilled in the art will readily observe that numerous modifications and alterations of the device and method may be made while retaining the teachings of the invention.

What is claimed is:

1. A testing apparatus with high efficiency and high accuracy comprising:
    a public test board having a plurality of public test channel sets, each public test channel set having a plurality of public signal terminals for receiving test signals;
    a first test board for testing a first device under test (DUT) having a plurality of pins;
    a first holder coupled to the first test board, the first holder including a plurality of sockets for containing the pins of the first DUT and a plurality of pins connected to the first test board;
    a second test board for testing a second DUT having a plurality of pins;
    a second holder coupled to the second test board, the second holder including a plurality of sockets for containing the pins of the second DUT and a plurality of pins connected to the second test board;
    wherein a plurality of first signal terminals are arranged on the first test board through a pin layout of the first DUT for respectively transmitting test signals to corresponding pins of the first DUT;
    wherein a plurality of second signal terminals are arranged on the first test board through a terminal layout of a first public test channel set of the plurality of public test channel sets for respectively receiving test signals transmitted from the first public test channel set;
    wherein a plurality of third signal terminals are arranged on the second test board through a pin layout of the second DUT for respectively transmitting test signals to corresponding pins of the second DUT;

wherein a plurality of fourth signal terminals are arranged on the second test board through a terminal layout of a second public test channel set of the plurality of public test channel sets for respectively receiving test signals transmitted from the second public test channel set;

wherein a plurality of first traces are arranged for electrically connecting the first signal terminals with the corresponding second signal terminals respectively; and wherein a plurality of second traces are arranged for electrically connecting the third signal terminals with the corresponding fourth signal terminals respectively.

2. The testing apparatus of claim 1 wherein the plurality of public test channel sets are arranged on the public test board based on a symmetrical layout.

3. The testing apparatus of claim 1 wherein the amount of the second signal terminals is equal to or less the amount of all public signal terminals in the plurality of public test channel sets.

4. The testing apparatus of claim 1 wherein the amount of the second signal terminals is equal to or less the amount of all public signal terminals in the first public test channel set.

5. The testing apparatus of claim 1 wherein the amount of the second signal terminals is more than the amount of the first signal terminals.

6. The testing apparatus of claim 1 wherein the amount of the first signal terminals is more than the amount of the pins in the first DUT.

7. The testing apparatus of claim 1 wherein the area of the first test board is equal to or less the area of the public test board.

8. The testing apparatus of claim 1 wherein the amount of the fourth signal terminals is equal to or less the amount of all public signal terminals in the plurality of public test channel sets.

9. The testing apparatus of claim 1 wherein the amount of the fourth signal terminals is equal to or less the amount of all public signal terminals in the second public test channel set.

10. The testing apparatus of claim 1 wherein the amount of the fourth signal terminals is more than the amount of the third signal terminals.

11. The testing apparatus of claim 1 wherein the amount of the third signal terminals is more than the amount of the pins in the second DUT.

12. The testing apparatus of claim 1 wherein the area of the second test board is equal to or less the area of the public test board.

13. The testing apparatus of claim 1 wherein the areas of the first and the second test boards are the same.

14. The testing apparatus of claim 1 wherein the first test board, the second test board and the public test board are printed circuit boards (PCBs).

* * * * *